(12) United States Patent
Bulzacchelli et al.

(10) Patent No.: US 7,792,185 B2
(45) Date of Patent: Sep. 7, 2010

(54) METHODS AND APPARATUS FOR CALIBRATING OUTPUT VOLTAGE LEVELS ASSOCIATED WITH CURRENT-INTEGRATING SUMMING AMPLIFIER

(75) Inventors: John Francis Bulzacchelli, Yonkers, NY (US); Matthew J. Park, Cambridge, MA (US)

(73) Assignee: International Business Machines Corporation, Armonk, NY (US)

( * ) Notice: Subject to any disclaimer, the term of this patent is extended or adjusted under 35 U.S.C. 154(b) by 835 days.

(21) Appl. No.: 11/672,309

(22) Filed: Feb. 7, 2007

(65) Prior Publication Data

US 2008/0187037 A1    Aug. 7, 2008

(51) Int. Cl.
*H03H 7/30* (2006.01)
(52) U.S. Cl. ..................................... 375/233
(58) Field of Classification Search ............ 375/292, 375/232, 233
See application file for complete search history.

(56) References Cited

U.S. PATENT DOCUMENTS

| | | | |
|---|---|---|---|
| 7,106,099 B1 * | 9/2006 | Nix | 326/40 |
| 7,126,408 B2 * | 10/2006 | Zerbe | 327/336 |
| 2007/0058710 A1 * | 3/2007 | Chang | 375/233 |

OTHER PUBLICATIONS

T. Beukema et al., "A 6.4-Gb/s CMOS SerDes Core with Feed-Forward and Decision-Feedback Equalization," IEEE Journal of Solid-State Circuits, Dec. 2005, pp. 2633-2645, vol. 40, No. 12.

R. Payne et al, "A 6.25-Gb/s Binary Transciever in 0.13-μm CMOS for Serial Data Transmission Across High Loss Legacy Backplane Channels," IEEE Journal of Solid-State circuits, Dec. 2005, pp. 2646-2657, vol. 40, No. 12.

S. Sidiropoulos et al., "A 700-Mb/s/pin CMOS Signaling Interface Using Current Integrating Receivers," IEEE Journal of Solid-State Circuits, May 1997, pp. 681-690, vol. 32, No. 5.

S.-J. Bae et al., "A 2 Gb/s 2-Tap DFE Receiver for Multi-Drop Single-Ended Signaling Systems with Reduced Noise," IEEE International Solid-State Circuits Conference, ISSCC, Feb. 2004, pp. 244-245, Session 13.

* cited by examiner

*Primary Examiner*—David B Lugo
(74) *Attorney, Agent, or Firm*—Anne V. Dougherty; Ryan, Mason & Lewis, LLP

(57) ABSTRACT

Methods and apparatus are disclosed for calibrating summing amplifiers based on current integration. For example, apparatus for calibrating output voltage levels of a current-integrating summing amplifier includes the following components. A duplicate integrator circuit is provided, wherein the duplicate integrator circuit replicates an integrator circuit of the current-integrating summing amplifier. A comparing circuit, coupled to the duplicate integrator circuit, is provided for comparing at least one output voltage level generated by the duplicate integrator circuit with a reference voltage level. A feedback loop circuit, coupled to the comparing circuit and the duplicate integrator circuit, is provided for adjusting at least one bias signal of the duplicate integrator circuit so that the output voltage level generated by the duplicate integrator circuit matches the reference voltage level, wherein the bias signal is applied to the integrator circuit of the current-integrating summing amplifier thereby calibrating output signal components due to multiple input signals of the current-integrating summing amplifier.

18 Claims, 8 Drawing Sheets

US 7,792,185 B2

METHODS AND APPARATUS FOR CALIBRATING OUTPUT VOLTAGE LEVELS ASSOCIATED WITH CURRENT-INTEGRATING SUMMING AMPLIFIER

This invention was made with Government support under Contract No. H98230-04-C-0920 awarded by the National Security Agency. The Government has certain rights in this invention.

FIELD OF THE INVENTION

The present invention relates generally to the design of analog amplifiers for signal processing and specifically to techniques for calibrating summing amplifiers based on current integration.

BACKGROUND OF THE INVENTION

A basic building block employed in many analog and mixed-signal electronic systems is the summing amplifier, or summer, which adds together two or more analog signals. At lower frequencies, an accurate summer can be realized as a closed-loop circuit based around a high-gain operational amplifier. However, the need to maintain feedback loop stability does entail compromises in the bandwidth of a closed-loop amplifier, so open-loop summing amplifiers are usually a more practical choice at very high signal frequencies (e.g., above 1 GHz).

While open-loop summing amplifiers can be employed to advantage in many high-frequency applications, ranging from radio and radar signal processing to high-speed data conversion, the example chosen here to illustrate the utility of such a circuit block is a decision-feedback equalizer (DFE) used to improve the reception of multi-gigabit-per-second serial data. Due to limited channel bandwidth, the electrical pulses (representing bits) transmitted over a serial link are broadened over more than one unit interval (UI), and the received signal suffers from intersymbol interference (ISI). The ISI from previous bits in the data stream can be effectively compensated if the receiver circuitry includes a DFE, whose block diagram is shown in FIG. 1.

In DFE 100, the previously decided bits are delayed via latches 106-2 through 106-N and fed back with weighted tap coefficients (H1, H2, . . . , HN) by way of feedback circuits 108-1 through 108-N. They are then added to the received input signal with analog summing amplifier 102. Because the input signal and the feedback signals are all high speed (i.e., multi-GHz), this analog summer is typically an open-loop amplifier. Examples of such summers may be found in T. Beukema et al., "A 6.4-Gb/s CMOS SerDes Core with Feed-Forward and Decision-Feedback Equalization," IEEE J. Solid-State Circuits, Vol. 40, pp. 2633-2645, December 2005; and R. Payne et al, "A 6.25-Gb/s Binary Transceiver in 0.13- μm CMOS for Serial Data Transmission Across High Loss Legacy Backplane Channels," IEEE J. Solid-State Circuits, Vol. 40, pp. 2646-2657, December 2005.

If the magnitudes and polarities of the tap weights are properly adjusted to match the channel characteristics, the ISI from earlier bits in the data stream will be canceled, and the bits can be detected by data slicer 104 with a low bit error rate (BER). The adjustment of the tap weights can be performed either manually or automatically by an appropriate adaptive algorithm. A fundamental advantage of a DFE over a simple linear equalizer is that the ISI is compensated without amplifying noise or crosstalk.

High-speed signal summation is easily accomplished in the current domain by connecting together ("dotting") the drains (or collectors if implemented in bipolar technology) of multiple differential pairs of transistors. In most past designs, the summed currents are converted into voltages by load resistors. A drawback of such resistive loading is relatively high power dissipation. A critical timing requirement for a DFE is that the feedback signals must settle accurately at the slicer input before the next data decision is made. To ensure fast enough settling, the RC time constant at the summer output nodes must be much smaller than one UI (e.g., 100 picosecond at 10 gigabits per second). The wiring and device parasitic capacitances all contribute to the total capacitance C. Even with optimum layout techniques, there is a lower limit to the achievable capacitance C, so the only practical way of achieving a small enough RC time constant is to reduce the load resistance R to a low value. To meet amplifier gain and voltage swing requirements, however, the reduction in R must be accompanied by a commensurate increase in operating currents, leading to higher power dissipation.

A more power-efficient summing amplifier can be implemented as a current integrator, in which the aforementioned load resistors are replaced by resettable capacitors. For highest power efficiency, the capacitors can be just C, the parasitic capacitances of the wiring and devices, see, e.g., S. Sidiropoulos et al., "A 700-Mb/s/pin CMOS Signaling Interface Using Current Integrating Receivers,"IEEE J. Solid-State Circuits, Vol. 32, pp. 681-690, May 1997. Integrating currents on parasitic capacitances is fundamentally much more power efficient than resistive current-to-voltage conversion. In the resistive scheme, the resistance value is deliberately chosen to be low enough that its impedance is much less than that of the parasitic capacitance over all frequencies of interest. This directly follows from the earlier requirement that the RC time constant be much less than one UI. Consequently, much higher operating currents are needed to generate the same output voltage levels with resistive loads. With typical circuit parameters, the power dissipation of a current-integrating summer may be almost an order of magnitude lower than that of a resistively loaded summer.

An important penalty of integrating currents onto parasitic capacitances is that the output voltage levels of the summer are highly sensitive to process variations. In addition, the output voltage levels depend on the integration time, which may need to be varied in some applications (such as a DFE receiving data with different bit rates). To realize a current-integrating summing amplifier with well-defined output voltage levels, it is desirable to have a calibration circuit which compensates for these sources of variability.

The above-referenced S. Sidiropoulos et al. article describes a calibration circuit based on replica feedback biasing which stabilizes the output voltage levels of a current integrating receiver with a single input. In the replica bias circuit, a large differential voltage is applied to a replica integrator stage so that its input differential pair is fully switched, steering all of its tail current to one of its output (i.e., drain) nodes. At the end of an integration period, the voltage at this node is sampled and compared to a reference voltage. If the sampled voltage is lower than the reference voltage, a feedback loop based on an operational amplifier boosts the tail current of the integrator, so that the integrated output voltage increases. If the sampled voltage is higher than the reference voltage, the feedback loop drops the tail current of the integrator, so that the integrated output voltage decreases. Once the feedback loop has stabilized, the sampled voltage matches the desired reference voltage. Since the bias voltage for the tail current is shared with the integrator stage receiving the actual data input signal, the output voltage levels of this stage are stabilized as well.

While the replica feedback biasing scheme described in S. Sidiropoulos et al. does stabilize the output voltage levels of an integrating receiver with a single input, a circuit for calibrating a current-integrating summing amplifier with multiple inputs has not been shown to date. While a DFE based on a current-integrating summer is described in S.-J. Bae et al., "A 2 Gb/s 2-Tap DFE Receiver for Multi-Drop Single-Ended Signaling Systems with Reduced Noise," ISSCC Dig. Tech. Papers, pp. 244-245, February 2004, no provision for calibrating its output voltage levels is described therein.

Accordingly, it would be desirable to provide improved techniques for calibrating summing amplifiers based on current integration.

SUMMARY OF THE INVENTION

Principles of the invention provide improved techniques for calibrating summing amplifiers based on current integration.

For example, in one aspect of the invention, apparatus for calibrating output voltage levels of a current-integrating summing amplifier includes the following components. A duplicate integrator circuit is provided, wherein the duplicate integrator circuit replicates an integrator circuit of the current-integrating summing amplifier. A comparing circuit, coupled to the duplicate integrator circuit, is provided for comparing at least one output voltage level generated by the duplicate integrator circuit with a reference voltage level. A feedback loop circuit, coupled to the comparing circuit and the duplicate integrator circuit, is provided for adjusting at least one bias signal of the duplicate integrator circuit so that the output voltage level generated by the duplicate integrator circuit matches the reference voltage level, wherein the bias signal is applied to the integrator circuit of the current-integrating summing amplifier thereby calibrating output signal components due to multiple input signals of the current-integrating summing amplifier.

The bias signal of the feedback loop circuit is preferably used to derive multiple current signals of the current-integrating summing amplifier. The multiple current signals are derived in accordance with a scale factor representative of a ratio of a capacitance value and an integration period associated with the current-integrating summing amplifier such that the output signal components are stabilized with respect to at least one of the capacitance value and the integration period.

In another aspect of the invention, a decision feedback equalizer includes the following components. A current-integrating summing amplifier is provided for summing input signals and tap weight-adjusted feedback signals. A calibration circuit, coupled to the current-integrating summing amplifier, is provided for calibrating output signal components due to multiple input signals of the current-integrating summing amplifier. A decision block, coupled to the current-integrating summing amplifier, is provided for detecting bits in the input signals.

In yet another aspect of the invention, a method for calibrating a current-integrating summing amplifier includes the following steps. A bias signal associated with a current is generated. The current is scaled by a ratio of a capacitance value and an integration period associated with the current-integrating summing amplifier. The bias signal is applied to the current-integrating summing amplifier such that output signal components due to multiple inputs of the current-integrating summing amplifier are stabilized with respect to at least one of the capacitance value and the integration period.

These and other objects, features and advantages of the present invention will become apparent from the following detailed description of illustrative embodiments thereof, which is to be read in connection with the accompanying drawings.

BRIEF DESCRIPTION OF THE DRAWINGS

FIG. 6 illustrates a second embodiment of a calibration circuit, with all summer input stages powered on.

DETAILED DESCRIPTION OF PREFERRED EMBODIMENTS

Principles of the invention realize that, for accurate signal processing, it is desirable that the output signal component due to each input have a calibrated magnitude. However, it is also realized that, for sake of hardware efficiency, the complexity of such a calibration circuit should not grow significantly as the number of summer inputs is increased. Thus, as an example, one would not want to use a separate replica bias circuit of the type described in the above-mentioned S. Sidiropoulos et al. article to calibrate each summer input.

Accordingly, as will be illustratively described below, principles of the invention provide an improved calibration circuit for stabilizing the output voltage levels of a current-integrating summing amplifier wherein a single replica bias circuit is used to calibrate the output signal components due to multiple inputs. The calibration circuit includes a duplicate integrator with loads matched to the integrators in the main signal paths. The calibration circuit samples one (or both) of the single-ended output voltages at the end of the integration period and compares the sampled voltage to a desired reference voltage. The result of this comparison drives a feedback loop (either analog or digital) which adjusts the bias current(s) of the duplicate integrator so that the sampled voltage matches the desired reference voltage. While the calibration circuit monitors a single-ended output signal of the summing amplifier, both the single-ended and differential output voltages at the end of the integration period are proportional to the product of the current-to-capacitance (I/C) ratio and the integration period (T). Thus, scaling all the currents of the integrators in the main signal paths in proportion to the bias current(s) of the duplicate integrator stabilizes the levels of the output voltages, including the output signal components due to each input. In one embodiment, all of the bias currents are scaled together by deriving them from a shared current mirror.

Before describing embodiments of the improved calibration circuit, we describe a multi-input summing amplifier with which principles of the invention may be employed.

Figure 1:
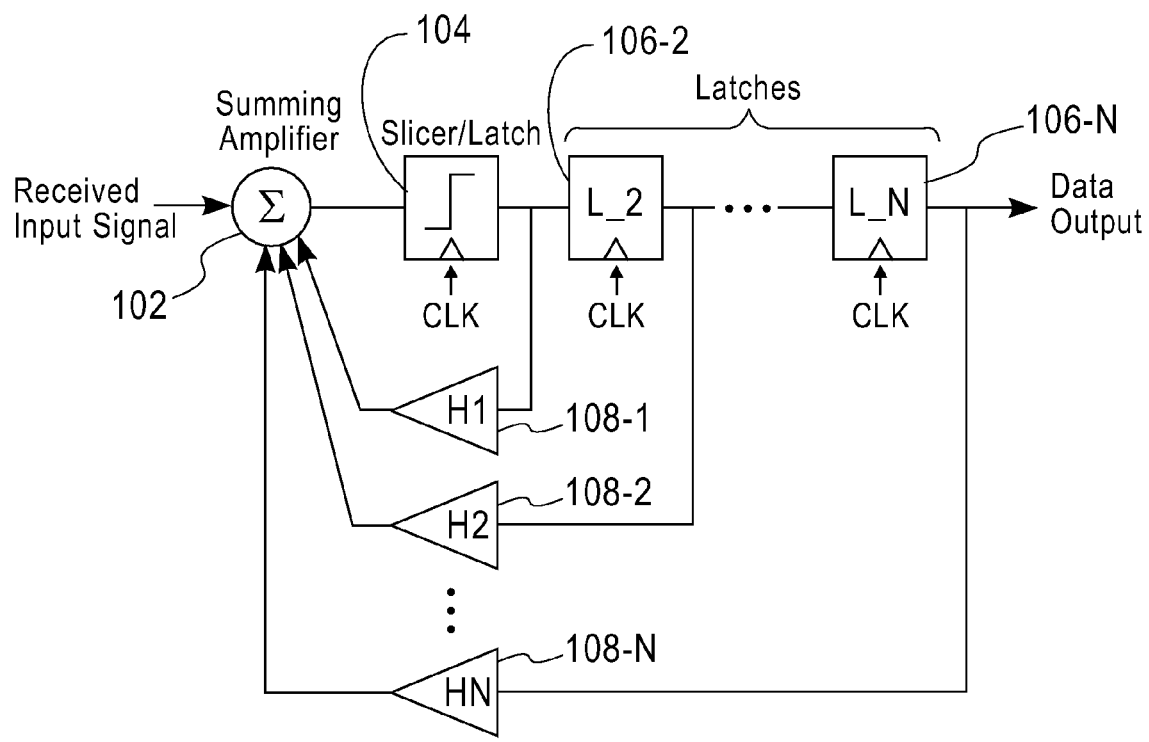
FIG. 1 illustrates a decision feedback equalizer (DFE).
Figure 2A:
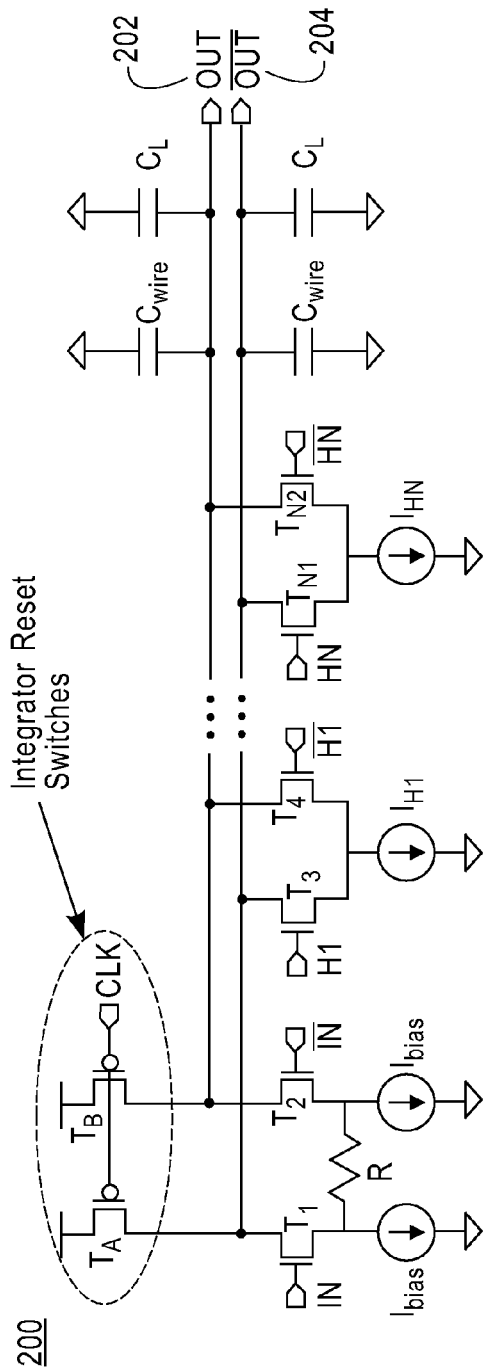
FIGS. 2A and 2B illustrate a current-integrating summing amplifier.

FIG. 2A depicts an example of a multi-input summing amplifier 200 based on current integration. Because this example circuit is intended to be used as the analog summer of a DFE, the signals being added are the received input signal (IN) and the weighted feedback taps (H1, H2, ..., HN). As mentioned above, the load resistors, in a conventional (i.e., resistively loaded) differential amplifier, are replaced by resettable capacitors. The capacitors on the output nodes are just the parasitic capacitances—specifically, the capacitances of the devices shown in the schematic, the wire capacitance ($C_{wire}$), and the load capacitance ($C_L$).

While CLK is low, positive channel field effect transistors (pFETs) TA and TB cause the integrator to operate in reset mode, and pull up the output nodes (202 and 204) to the positive power supply voltage level.

When CLK goes high, the pFETs are turned off, the reset period ends, and the drain currents of the differential pairs (negative channel FET (nFET) pairs T1 & T2, T3 & T4, ... TN1 & TN2) begin to discharge the capacitors. During this integration period (T long), charge is integrated (negatively) on the capacitors and represents the sum of the currents from the various input signals.

Figure 2B:
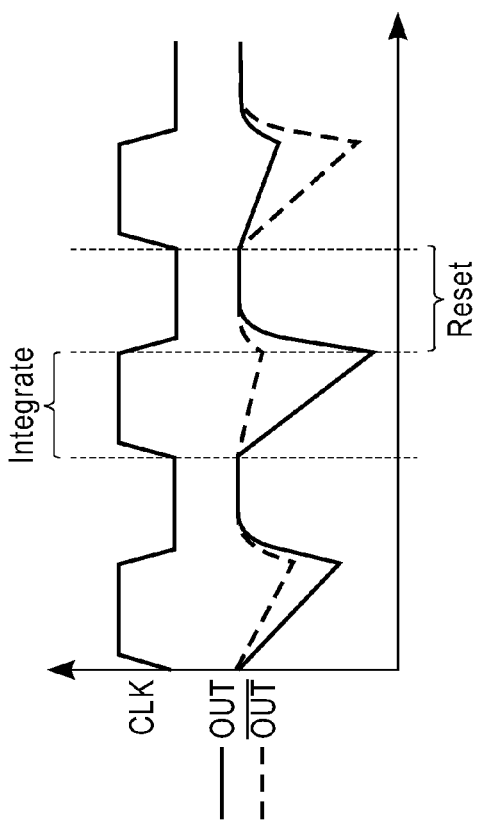

In the DFE application, T is often one UI long, though other integration times (such as UI/2, UI/4, etc.) are also acceptable choices. With nonzero differential inputs, the two output nodes are discharged at different rates, and a positive or negative differential output voltage is developed by the end of the integration period, as indicated in FIG. 2B. At the end of the integration period, the differential output voltage is sampled by another circuit (e.g., a decision-making slicer in the case of a DFE), and then the capacitor voltages are again reset to the power supply by the pFETs.

It is to be appreciated that some of the schematic details shown in FIG. 2A are employed to improve performance in the DFE application. The differential pair (T1 & T2) driven by the received input signal (IN) is resistively degenerated (represented by R) for more linear amplification of this signal. Resistive degeneration is not employed in the other differential pairs, as these pairs are used as current switches controlled by the binary DFE feedback signals H1, H2, ..., HN. The tap weights of the DFE can be digitally controlled by setting the tail currents $I_{H1}, I_{H2}, \ldots, I_{HN}$ with current digital-to-analog converters (DACs).

An examination of the expression for the differential output voltage at the end of the integration period shows why a current-integrating summing amplifier can be power-efficient and also reveals the need for a calibration circuit such as provided by principles of the present invention. Let C be the total capacitance on each output node, and let ΔI equal the difference in discharge currents during the integration time T. Then, the differential output voltage $\Delta V_{out}$ at the end of the integration period equals:

$$\Delta V_{out} = T\Delta I/C.$$

If C is small because it consists only of parasitic capacitances, large signals can be generated with low values of current (and therefore low power dissipation), as it is the ratio of current to capacitance (ΔI/C) that determines the differential output voltage. Two of the terms in the above expression for $\Delta V_{out}$ are potentially large sources of variability in the output voltage levels of the summer. While stable current levels can be generated by a number of well-known techniques (e.g., current mirroring from an accurate reference current), the parasitic capacitances (C) in a typical semiconductor process have large run-to-run variations, which may not even be well-characterized. In some applications, such as a serial link with variable bit rates, the integration time (T) may need to be changed as well. The variability in C and T affects the output signal component due to each input of the summing amplifier. By Kirchhoff's current law (KCL):

$$\Delta I = \Delta i_{IN} + \Delta i_{H1} + \Delta i_{H2} + \ldots + \Delta i_{HN},$$

where $\Delta i_{IN}$ equals the differential drain current of the transistor pair driven by the received input signal (time-averaged over the integration period), $\Delta i_{H1}$ equals the differential drain current of the transistor pair for the H1 tap, $\Delta i_{H2}$ equals the differential drain current of the transistor pair for the H2 tap, and so on. Therefore:

$$\Delta V_{out} = T(\Delta i_{IN} + \Delta i_{H1} + \Delta i_{H2} + \ldots + \Delta i_{HN})/C$$
$$= T\Delta i_{IN}/C + T\Delta i_{H1}/C + T\Delta i_{H2}/C + \ldots + T\Delta i_{HN}/C.$$

This last expression directly shows that each component of the output signal is proportional to T/C. Therefore, if all of the currents being summed are scaled by a factor of C/T, the magnitude of each output signal component can be stabilized against variations in C or T. Principles of the present invention provide calibration circuits for accomplishing this in a hardware-efficient manner.

Figure 3:
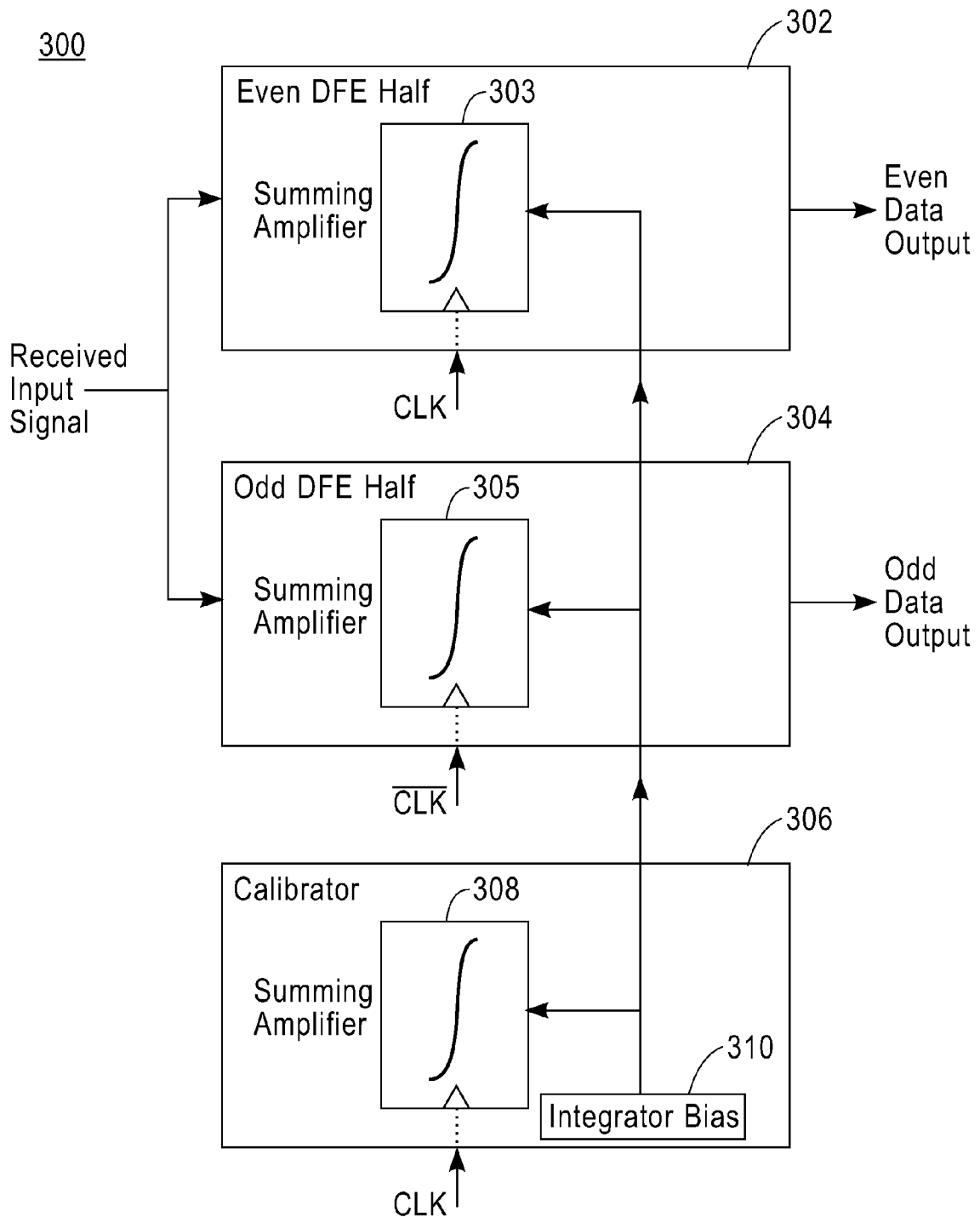
FIG. 3 illustrates a half-rate DFE with a calibration circuit for current-integrating summing amplifiers.

FIG. 3 illustrates how a calibrator based on a replica bias circuit can be used to compensate the bias currents of the current-integrating summing amplifiers in the main signal paths. This particular example shows a DFE 300 with a half-rate architecture, in which the even bits are sampled on one edge (either rising or falling) of the half-rate CLK signal (even DFE Half 302), and the odd bits are sampled on the opposite polarity edge of the same half-rate CLK signal (odd DFE Half 304). While the example shown in the figure shows one current-integrating summer in each DFE half (i.e., 303 in even half, and 305 in odd half), multiple current-integrating summers could be used in each DFE half if a speculative architecture such as that described in T. Beukema et al., "A 6.4-Gb/s CMOS SerDes Core with Feed-Forward and Decision-Feedback Equalization," IEEE J. Solid-State Circuits, Vol. 40, pp. 2633-2645, December 2005 is employed. A half-rate architecture is a natural choice when a current-integrating summer is used, as the current-integrating summer(s) in one DrE half can be resetting while the current-integrating summer(s) in the other DFE half is (are) integrating.

Calibrator 306 includes duplicate integrator 308 with load capacitances matched to the integrators in the main signal paths. As explained below, a feedback loop within the calibrator is used to adjust the integrator bias 310 so that the output voltage levels of this integrator are stabilized to known values. This compensating bias is then passed to the integrators in the main signal paths so that (assuming good matching) their output voltage levels are stabilized as well.

The integration time (T) of each summing amplifier depends on the duty cycle of CLK. If this duty cycle is close to 50%, the integration times of the summing amplifiers in the even and odd DFE halves will match, and a single compensating bias can be used for the summing amplifiers. In this case, it does not matter which phase of CLK is used to clock the calibrator. In the case of significant duty cycle distortion, however, it may be necessary to generate two compensating biases. One bias (for the even DFE half) could be generated with a calibrator clocked by CLK (as shown in the figure), and another bias (for the odd DFE half) could be generated with a calibrator clocked by the complement of CLK (not shown in the figure).

Figure 4:
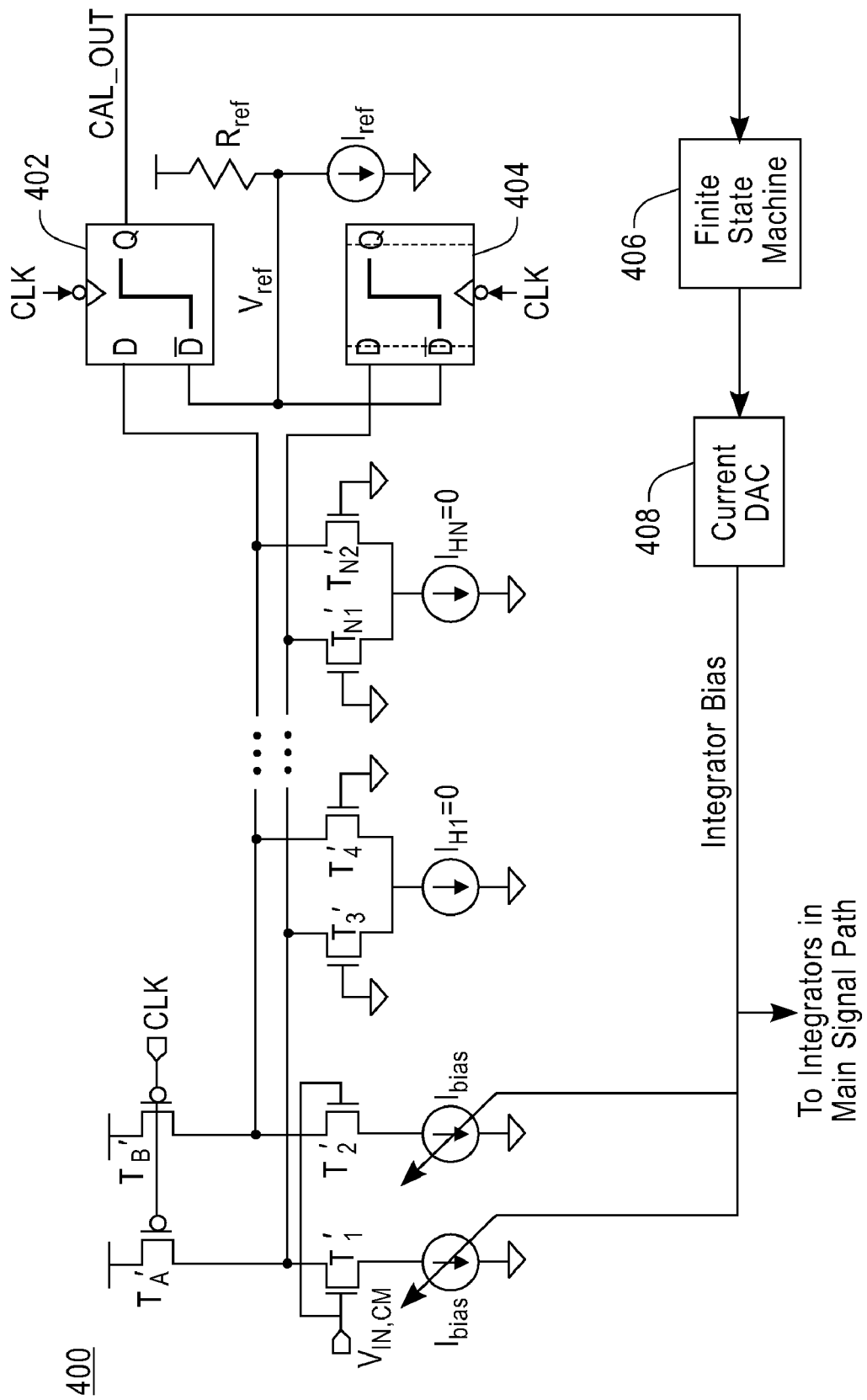
FIG. 4 illustrates a first embodiment of a calibration circuit for setting output voltage levels of current-integrating summing amplifier.

FIG. 4 shows one representative embodiment of a calibration circuit 400 for setting the output voltage levels of a current-integrating summing amplifier. The nFETs and pFETs which form the duplicate integrator have device sizes matched to those of the current-integrating summer shown in FIG. 2A. That is, TA' in FIG. 4 corresponds to TA in FIG. 2A, and so on.

This particular embodiment of the calibration circuit operates by monitoring the common-mode output voltage at the end of the integration period. Since no differential output voltage is desired, the gates of the leftmost differential pair (T1' and T2') are both tied to an appropriate common-mode voltage ($V_{IN,CM}$), the degeneration resistor of this differential pair is eliminated, and the tail currents of the other differential pairs (T3' & T4' . . . TN1' & TN2'), which set the DFE tap coefficients, are set to zero.

The common-mode output voltage at the end of the integration period is compared with a reference voltage $V_{ref}$ by a clocked comparator. Two clocked comparators 402 and 404 are included in the circuit for balancing the load capacitances on both output nodes, but only one of the comparator outputs needs to be read by the feedback loop setting the integrator bias currents. In an alternative embodiment, however, both comparator outputs could be read by the feedback loop, for sake of redundancy.

If the clocked comparator is the same circuit as the decision-making slicers in the main signal paths, the load capacitances of the duplicate integrator and the original summing amplifiers will be well-matched. The comparator output (CAL_OUT) is examined by digital logic in the form of finite state machine 406. If the integrator bias currents ($I_{bias}$) are too low so that the common-mode output voltage at the end of the integration period is higher than $V_{ref}$, and the comparator output is all or mostly logic 1's, the finite state machine will increase the integrator bias currents via current DAC 408.

Similarly, this digital feedback loop will decrease the integrator bias currents when the common-mode output voltage at the end of the integration period is too low (as indicated by a comparator output which is all or mostly logic 0's).

When the feedback loop has converged to its final state, the comparator operates close to metastability, producing approximately equal numbers of 1's and 0's. At this point, the drop in the common-mode output voltage during integration ($TI_{bias}/C$) equals the difference in voltage ($I_{ref}R_{ref}$) between $V_{ref}$ and the positive supply:

$$TI_{bias}/C = I_{ref}R_{ref}$$

which can be rewritten as:

$$I_{bias} = I_{ref}R_{ref}(C/T).$$

This last expression shows that the calibration circuit produces a current scaled by a factor of (C/T), which, as demonstrated above, is the exact dependence needed to calibrate the output voltage levels of the current-integrating summer.

As mentioned above, all of the currents in the current-integrating summer need to be scaled by the same (C/T) factor. Once one current has been correctly compensated by the calibration circuit, the other scaled currents can be generated with well-known circuits such as current mirrors.

Figure 5:
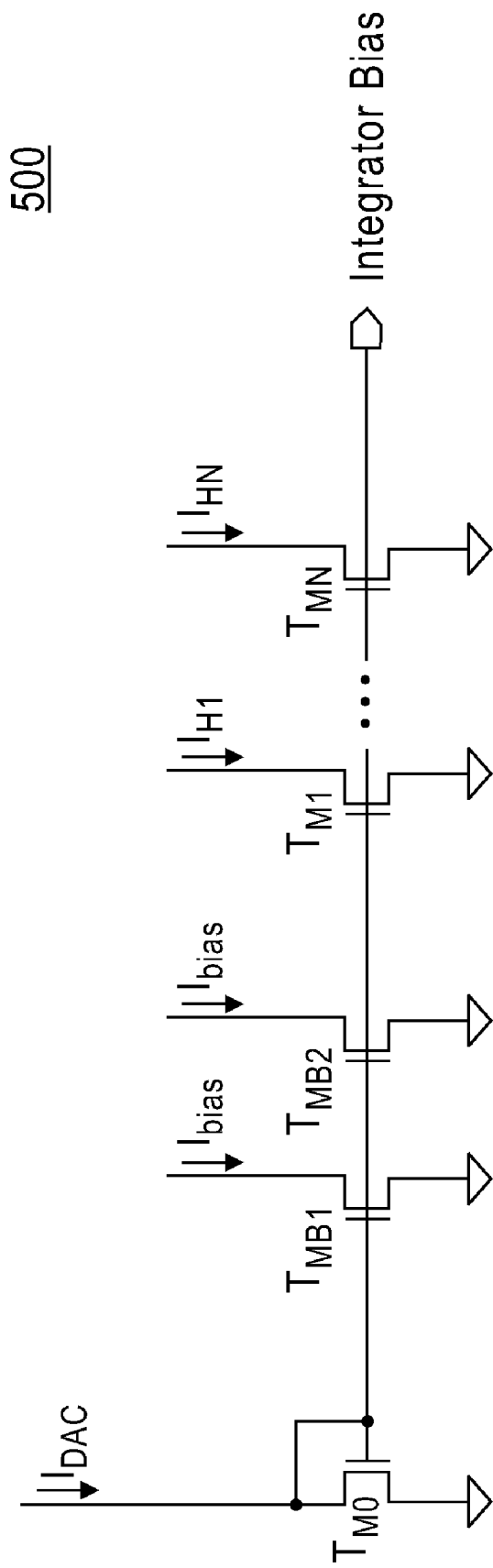
FIG. 5 illustrates a current mirror arrangement for scaling all bias currents in proportion to a current digital-to-analog converter (DAC) output.

As an illustrative example, FIG. 5 shows a current mirror arrangement 500 which can be connected to the output of the current DAC shown in FIG. 4. Ignoring the finite output resistances of transistors TM0, TMB1, TMB2 and TM1 through TMN, as well as the effects of random mismatch, the ratios of the output currents ($I_{bias}$, $I_{H1}$, $I_{H2}$, . . . , $I_{HN}$) to each other depend only on the width-to-length (W/L) ratios of the devices. As just explained in the previous paragraph, the feedback loop of the calibration circuit ensures that the $I_{bias}$ output currents are scaled by the correct (C/T) factor. Consequently, all of the output currents are scaled in the desired fashion. The current mirror of FIG. 5 is only a representative example. It will be obvious to those skilled in the art that other current mirror topologies, including those with improved current mirroring accuracy, can be substituted for this one. Another modification easily made is to add passgate structures between the Integrator Bias line and the gates of the output transistors so that the output currents can be turned on and off. If an output transistor is segmented into several elements which can be turned on and off by a digital control word, one can realize a digitally controlled current source (i.e., current DAC) whose full-scale current is scaled by (C/T); such a current source could be used in the DFE application to accomplish digital adjustment of the tap coefficient weights.

When the current-integrating summing amplifier of FIG. 2A is used as the analog summer of a DFE, the common-mode output voltage at the end of the integration period is a function of the tap weight currents $I_{H1}$, $I_{H2}$, . . . , $I_{HN}$. In the calibration circuit of FIG. 4, the common-mode output voltage at the end of the integration period is regulated to $V_{ref}$ with the tap weight currents $I_{H1}$, $I_{H2}$, . . . , $I_{HN}$ set to zero. Therefore, the common-mode output voltage of the current-integrating summers in the main signal paths will fall below $V_{ref}$ when $I_{H1}$, $I_{H2}$, . . . , $I_{HN}$ are nonzero. If the common-mode voltages fall too low, integrator nonlinearity may result. One way of avoiding this potential problem is to raise the value of $V_{ref}$ in FIG. 4 to allow sufficient margin to accommodate the extra common-mode drop that occurs in the integrators of the main signal paths.

Figure 6:
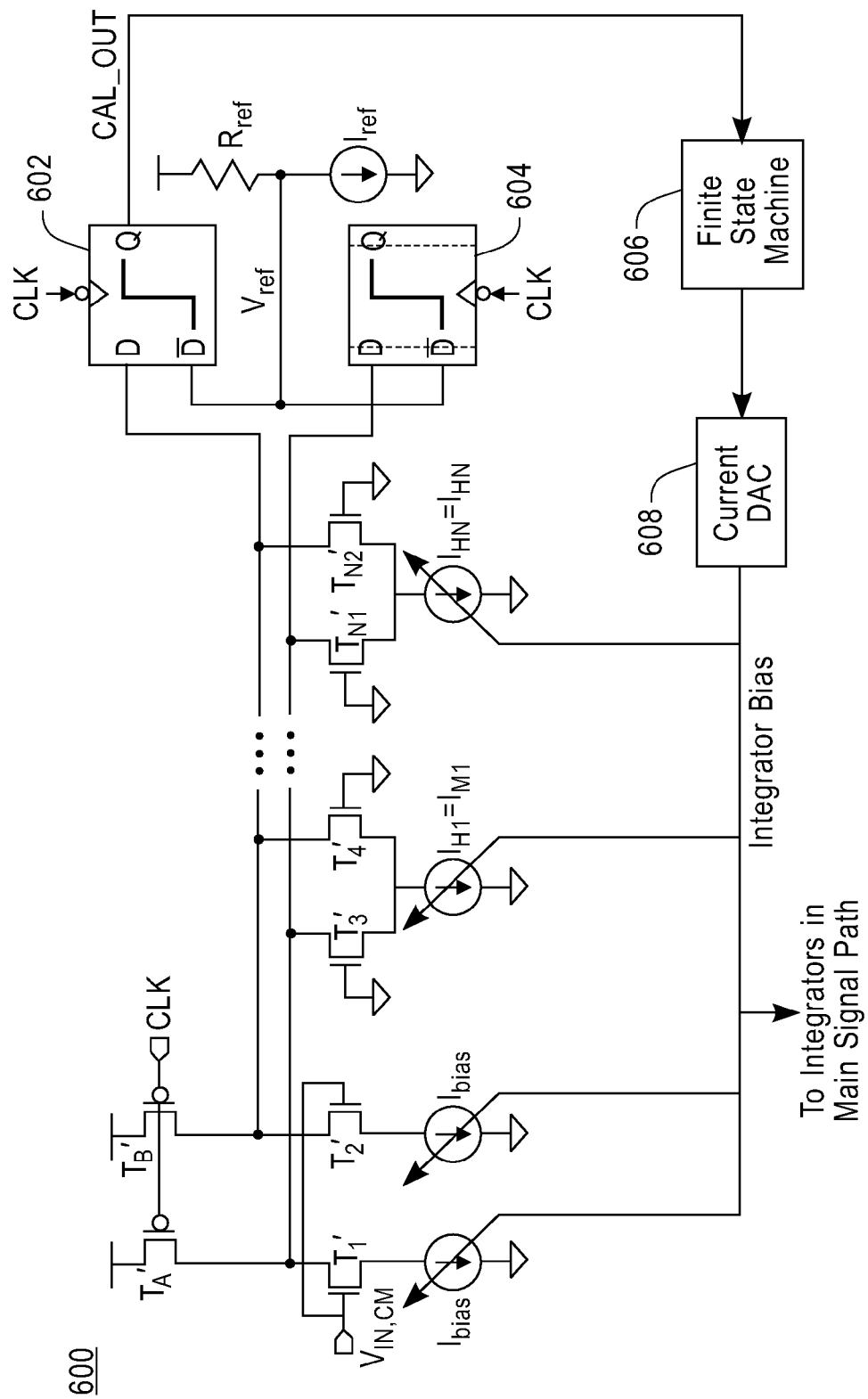

Alternatively, one can employ a modified calibration circuit, such as the one shown in FIG. 6. Calibration circuit 600 operates by monitoring the drop in the output voltage of the integrator when the tap weight currents $I_{H1}$, $I_{H2}$, . . . , $I_{HN}$ are set to their maximum values $I_{M1}$, $I_{M2}$, . . . , $I_{MN}$. Maximum here means relative to $I_{bias}$; as indicated in the figure, all of the currents are scaled up and down by the feedback loop of the calibration circuit. By tying the gates of the transistor pairs for the H1, H2, . . . , HN taps to the positive supply and to ground, all of the tap weight currents $I_{H1}$, $I_{H2}$, . . . , $I_{HN}$ are steered to one of the output nodes, whose voltage at the end of the integration period is compared via clocked comparator 602 (recall that clocked comparator 604 may be used to balance the load capacitances on both output nodes) with $V_{ref}$ to generate the CAL_OUT signal examined by finite state machine 606. Therefore, the feedback loop acts to adjust the integrator bias signal generated by current DAC 608 (which scales all of the integrator currents in a ganged fashion) so that the lowest possible single-ended output voltage is regulated to $V_{ref}$ (chosen to be within the linear operating range of the integrator).

There are many possible ways to implement a calibration circuit which falls between the extremes of FIG. 4 and FIG. 6. For instance, some but not all of the currents $I_{H1}$, $I_{H2}$, . . . , $I_{HN}$ could be set to zero or to intermediate values between 0 and $I_{M1}$, $I_{M2}$, . . . , $I_{MN}$. Such straightforward modifications and variations of the disclosed embodiments will be obvious to those skilled in the art and do not depart from the spirit and scope of the invention. In each case, the basic operating principle remains the same: the calibration circuit generates a bias current (or currents) with the desired (C/T) scale factor, from which are derived all of the currents in the current-integrating summer.

The embodiments of FIG. 4 and FIG. 6 show only a single current DAC being used by the finite state machine to control all of the integrator bias currents. While this arrangement is the most efficient in the use of hardware, other arrangements may be desirable in some applications.

For instance, if a priori information about the channel characteristics can be provided, it may be desirable to reconfigure the DFE for different maximum tap weights. For example, if it were known that, for this channel, the H3 tap weight needs to be much larger than the H2 tap weight, it would be advantageous to set $I_{M3}$ to be larger than $I_{M2}$.

Figure 7:
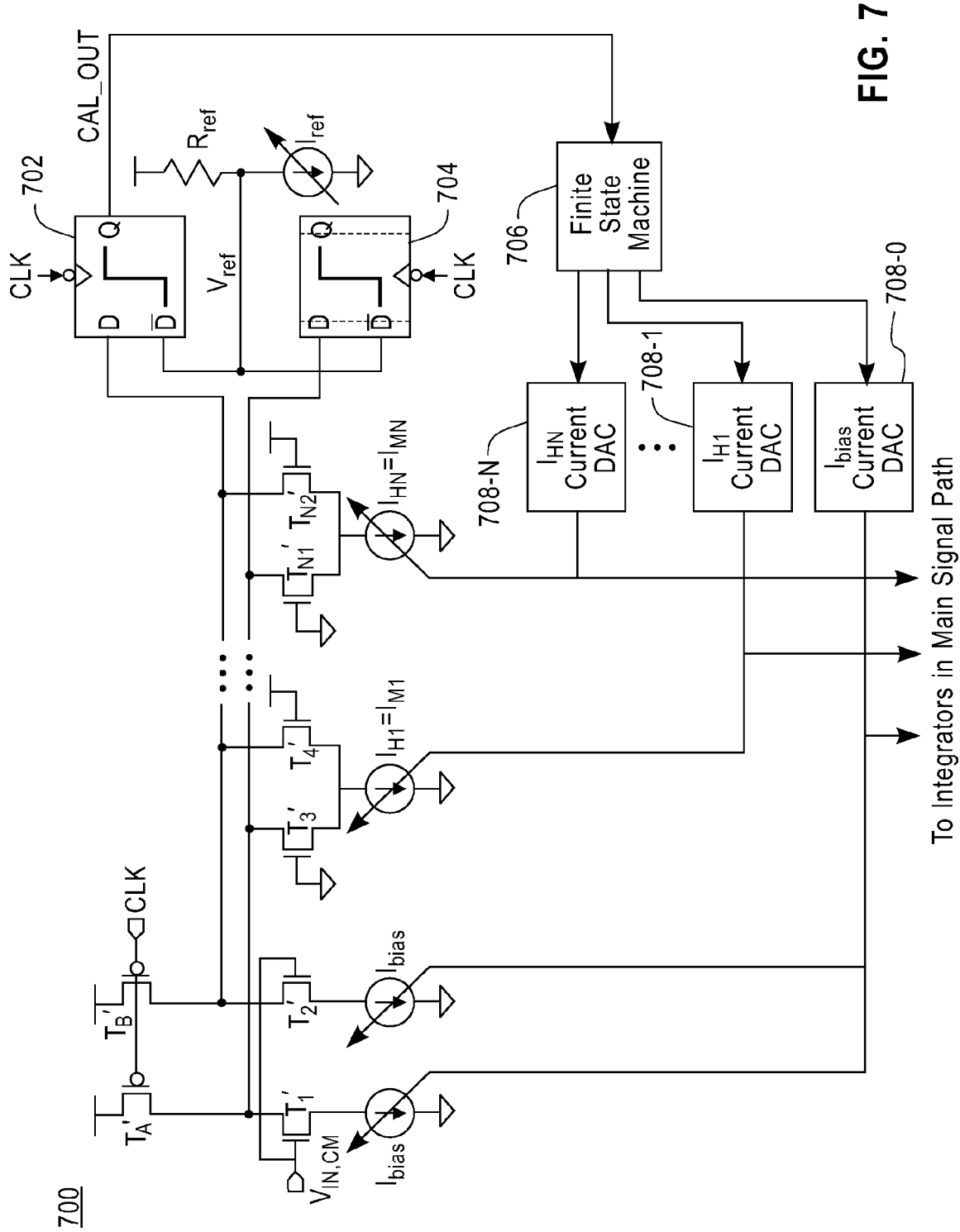
FIG. 7 illustrates a third embodiment of a calibration circuit, with individual calibration of each summer input.

Such reconfigurability can be achieved with calibration circuit 700 shown in FIG. 7. While clocked comparators 702 & 704 and finite state machine 706 perform the same functions as described above, the calibration circuit of FIG. 7 provides that the bias current of each summer input ($I_{bias}$, $I_{H1}$, $I_{H2}$, ..., $I_{HN}$) is set with a separate current DAC (708-0 through 708-N). Calibration of each summer input can be accomplished individually. First the current DAC for $I_{bias}$ is adjusted while all of the other current DACs (i.e., for $I_{H1}$, $I_{H2}$, ..., $I_{HN}$) are set to zero. During this step of the calibration, $I_{ref}$ (which determines how far $V_{ref}$ is from the positive supply) is set to a value appropriate for setting the common-mode output voltage drop due to $I_{bias}$ alone. To set $I_{ref}$, a current DAC could be used, but this detail is not shown in FIG. 7.

Next the current DAC for $I_{H1}$ is adjusted while all the other current DACs are set to zero. During this step of the calibration, $I_{ref}$ is set to a value appropriate for setting the full-scale value of the H1 tap weight. The calibration procedure continues until all of the current DACs have been adjusted. The tap weights of the DFE can be reconfigured for different maximum values by changing the values of $I_{ref}$ used during each step of the calibration. After calibration is finished, all of the current DACs can be set to their calibrated values, and the appropriate bias voltages (or currents) passed to the integrators in the main signal paths.

Figure 8:
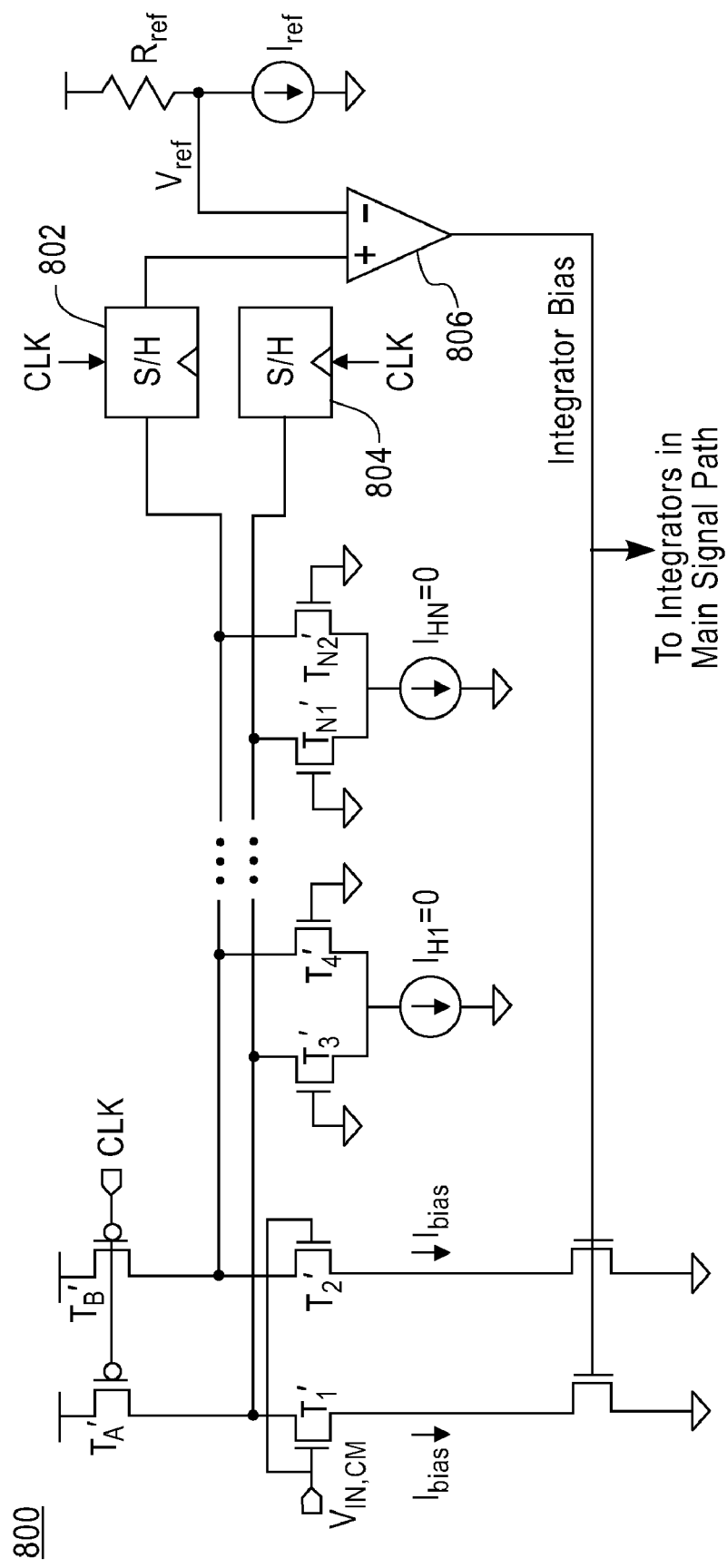
FIG. 8 illustrates an alternative embodiment of a calibration circuit, with analog feedback loop.

It is also possible to compensate the current-integrating summing amplifier with a calibration circuit based on an analog feedback loop instead of a digital one. As a representative example, FIG. 8 shows calibration circuit 800 with analog feedback loop that is identical in function to the calibrator of FIG. 4. The clocked comparators of FIG. 4 are replaced by a pair of sample-and-hold (S/H) circuits 802 and 804, which sample and then hold the output voltages at the end of the integration period. This arrangement is particularly suitable if sample-and-holds are also used after the current-integrating summing amplifiers in the main signal paths. Operational amplifier 806 compares one of the sample-and-hold outputs to $V_{ref}$ and through negative feedback adjusts the integrator bias signal until the common-mode output voltage at the end of the integration period equals the desired value. One drawback of an analog feedback loop such as the one shown in FIG. 8 is that it cannot be powered off after the feedback loop has converged to its final state, as the sample-and-holds do not have infinite hold times. In contrast, once the finite state machine has learned the correct settings for the current DACs, the duplicate integrators shown in FIG. 4, FIG. 6, and FIG. 7 can be shut down, reducing the power dissipation overhead of the calibrator.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. Apparatus for calibrating output voltage levels of a current-integrating summing amplifier, comprising:
   a duplicate integrator circuit, wherein the duplicate integrator circuit replicates an integrator circuit of the current-integrating summing amplifier;
   a comparing circuit coupled to the duplicate integrator circuit, the comparing circuit comparing at least one output voltage level generated by the duplicate integrator circuit with a reference voltage level; and
   a feedback loop circuit coupled to the comparing circuit and the duplicate integrator circuit, the feedback loop circuit adjusting at least one bias signal of the duplicate integrator circuit so that the output voltage level generated by the duplicate integrator circuit matches the reference voltage level, wherein the bias signal is applied to the integrator circuit of the current-integrating summing amplifier thereby calibrating output signal components due to multiple input signals of the current-integrating summing amplifier.

2. The apparatus of claim 1, wherein the bias signal of the feedback loop circuit is used to derive multiple current signals of the current-integrating summing amplifier.

3. The apparatus of claim 2, wherein the multiple current signals are derived in accordance with a scale factor representative of a ratio of a capacitance value and an integration period associated with the current-integrating summing amplifier such that the output signal components are stabilized with respect to at least one of the capacitance value and the integration period.

4. The apparatus of claim 2, wherein the multiple current signals are derived via a current mirror circuit.

5. The apparatus of claim 1, wherein the feedback loop circuit comprises a digital feedback loop circuit.

6. The apparatus of claim 5, wherein the comparing circuit comprises at least one clocked comparator.

7. The apparatus of claim 6, wherein the digital feedback loop circuit further comprises:
   a finite state machine, coupled to the clocked comparator, for generating a digital bias current signal based on a result from the clocked comparator; and
   at least one current digital-to-analog converter coupled to the finite state machine for converting the digital bias current signal to at least one analog bias signal.

8. The apparatus of claim 7, wherein the digital feedback loop circuit further comprises at least a second current digital-to-analog converter coupled to the finite state machine for converting the digital bias current signal to at least a second analog bias signal.

9. The apparatus of claim 1, wherein the feedback loop circuit and the duplicate integrator circuit are configured such that the bias signal is adjusted so that the lowest possible output voltage level generated by the integrator circuit of the current-integrating summing amplifier is regulated to the reference voltage level.

10. The apparatus of claim 1, wherein the feedback loop circuit comprises an analog feedback loop circuit.

11. The apparatus of claim 10, wherein the comparing circuit comprises at least one sample and hold circuit.

12. The apparatus of claim 10, wherein the analog feedback loop circuit comprises an operational amplifier for generating an analog bias signal based on the output voltage level generated by the duplicate integrator circuit.

13. A decision feedback equalizer, comprising:
a current-integrating summing amplifier for summing input signals and tap weight-adjusted feedback signals;
a calibration circuit coupled to the current-integrating summing amplifier and configured to calibrate output signal components due to multiple input signals of the current-integrating summing amplifier; and
a decision block coupled to the current-integrating summing amplifier for detecting bits in the input signals;
wherein the calibration circuit further comprises:
a duplicate integrator circuit, wherein the duplicate integrator circuit replicates an integrator circuit of the current-integrating summing amplifier;
a comparing circuit coupled to the duplicate integrator circuit, the comparing circuit comparing at least one output voltage level generated by the duplicate integrator circuit with a reference voltage level; and
a feedback loop circuit coupled to the comparing circuit and the duplicate integrator circuit, the feedback loop circuit adjusting at least one bias signal of the duplicate integrator circuit so that the output voltage level generated by the duplicate integrator circuit matches the reference voltage level, wherein the bias signal is applied to the integrator circuit of the current-integrating summing amplifier thereby calibrating output signal components due to multiple input signals of the current-integrating summing amplifier.

14. The decision feedback equalizer of claim 13, wherein the bias signal of the feedback loop circuit is used to derive multiple current signals of the current-integrating summing amplifier.

15. The decision feedback equalizer of claim 14, wherein the multiple current signals are derived in accordance with a scale factor representative of a ratio of a capacitance value and an integration period associated with the current-integrating summing amplifier such that the output signal components are stabilized with respect to at least one of the capacitance value and the integration period.

16. The decision feedback equalizer of claim 14, wherein the multiple current signals are derived via a current mirror circuit.

17. The decision feedback equalizer of claim 13, wherein the feedback loop circuit comprises a digital feedback loop circuit.

18. The decision feedback equalizer of claim 13, wherein the feedback loop circuit comprises an analog feedback loop circuit.

* * * * *